United States Patent
Shimomugi et al.

(10) Patent No.: US 10,530,288 B2
(45) Date of Patent: Jan. 7, 2020

(54) MOTOR DRIVE APPARATUS AND AIR CONDITIONER

(71) Applicant: Mitsubishi Electric Corporation, Tokyo (JP)

(72) Inventors: Takuya Shimomugi, Tokyo (JP); Yosuke Shinomoto, Tokyo (JP); Katsuhiko Saito, Tokyo (JP); Norikazu Ito, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/752,608

(22) PCT Filed: Sep. 4, 2015

(86) PCT No.: PCT/JP2015/075188
§ 371 (c)(1),
(2) Date: Feb. 14, 2018

(87) PCT Pub. No.: WO2017/037942
PCT Pub. Date: Mar. 9, 2017

(65) Prior Publication Data
US 2019/0097563 A1    Mar. 28, 2019

(51) Int. Cl.
*H02M 7/5387*    (2007.01)
*H02P 27/06*    (2006.01)
(Continued)

(52) U.S. Cl.
CPC .............. *H02P 27/08* (2013.01); *F25B 31/02* (2013.01); *H02M 1/08* (2013.01); *H02M 7/53871* (2013.01); *H02M 2001/0054* (2013.01)

(58) Field of Classification Search
CPC ..... H02M 7/5387; H02M 5/458; H02P 27/06; H02P 27/08; B62D 5/046
See application file for complete search history.

(56) References Cited

U.S. PATENT DOCUMENTS 8,493,016 B2    7/2013   Miyamoto
9,479,083 B2    10/2016  Makita et al.
(Continued)

FOREIGN PATENT DOCUMENTS

CN    103580528 A    2/2014
JP    2005-295661 A   10/2005
(Continued)

OTHER PUBLICATIONS

Office action dated Jul. 3, 2018 issued in corresponding JP patent application No. 2017-537177 (and English machine translation thereof).

(Continued)

*Primary Examiner* — Kawing Chan
*Assistant Examiner* — Cortez M Cook
(74) *Attorney, Agent, or Firm* — Posz Law Group, PLC

(57) ABSTRACT

A motor drive apparatus which drives a motor includes inverter modules equal in number to phases of the motor. Each of the inverter modules includes a plurality of switching element pairs. Each of the switching element pairs is defined by two switching elements connected in series. In each of the inverter modules, the plurality of switching element pairs are connected in parallel, and each of resistance values of gate resistors connected to the switching elements is set for the corresponding switching element connected thereto.

9 Claims, 5 Drawing Sheets

(51) Int. Cl.
*B62D 5/04* (2006.01)
*H02M 5/458* (2006.01)
*H02P 27/08* (2006.01)
*H02M 1/08* (2006.01)
*F25B 31/02* (2006.01)
*H02M 1/00* (2006.01)

(56) References Cited

U.S. PATENT DOCUMENTS

| | | | | |
|---|---|---|---|---|
| 2005/0040781 | A1* | 2/2005 | Nagase | B62D 5/046 318/432 |
| 2010/0118569 | A1* | 5/2010 | Kono | H02M 5/458 363/34 |
| 2011/0148337 | A1* | 6/2011 | Yamada | H01L 25/072 318/400.26 |
| 2011/0309776 | A1* | 12/2011 | Miyamoto | H02P 27/06 318/139 |
| 2014/0029323 | A1* | 1/2014 | Makita | H02M 7/5387 363/132 |
| 2015/0121929 | A1* | 5/2015 | Yamada | H02P 27/06 62/238.1 |
| 2015/0249411 | A1* | 9/2015 | Nakamura | H02P 6/18 318/400.3 |
| 2017/0241691 | A1 | 8/2017 | Yamakawa et al. | |
| 2017/0279377 | A1 | 9/2017 | Shimomugi et al. | |
| 2017/0288595 | A1 | 10/2017 | Shinomoto et al. | |

FOREIGN PATENT DOCUMENTS

| | | |
|---|---|---|
| JP | 4609075 B2 | 10/2010 |
| JP | 2012-005278 A | 1/2012 |
| JP | 2012-039790 A | 2/2012 |
| JP | 2013-070532 A | 4/2013 |
| JP | 2014-027831 A | 2/2014 |
| JP | 5559265 B2 | 6/2014 |
| WO | 2016/071963 A1 | 5/2016 |
| WO | 2016/071964 A1 | 5/2016 |
| WO | 2016/071965 A1 | 5/2016 |

OTHER PUBLICATIONS

International Search Report of the International Searching Authority dated Oct. 6, 2015 for the corresponding International application No. PCT/JP2015/075188 (and English translation).

Office Action dated Nov. 1, 2019 issued in corresponding CN patent application No. 201580082626.4 (and English translation).

* cited by examiner

US 10,530,288 B2

MOTOR DRIVE APPARATUS AND AIR CONDITIONER

CROSS REFERENCE TO RELATED APPLICATION

This application is a U.S. national stage application of International Patent Application No. PCT/JP2015/075188 filed on Sep. 4, 2015, the disclosure of which is incorporated herein by reference.

TECHNICAL FIELD

The present invention relates to a motor drive apparatus which includes switching elements, and to an air conditioner.

BACKGROUND

Conventionally, when manufacturing a switching element, a rectangular chip cut out from a circular wafer is mounted on a metal plate or the like. Crystal defects are present in the wafer, and chips with crystal defects cannot be used. When a chip area is large, the probability of including crystal defects in the chip is so high that the yield can deteriorate. On the other hand, when the chip area is small, the probability of including crystal defects in the chip is so low that the yield can be improved. Reducing the chip area improves the yield, thereby achieving the cost reduction of the switching element.

Compared to the switching element having the large chip area, the switching element of the small chip area has the small current capacity. However, it is possible to achieve an increase in current by connecting the switching elements of the small chip areas in parallel. Patent Literature 1 discloses a technique in which when switching elements are connected in parallel, the inductances of individual signal lines which supply driving signals to the parallel-connected switching elements are made equal to one another in order to prevent the switching element from malfunctioning or being damaged due to the difference in the switching timing among the switching elements.
Patent Literature
  Patent Literature 1: Japanese Patent No. 5559265

Unfortunately the above-described conventional technique poses the problem of equalization of the inductances being difficult due to the relationship with positions of terminals used for connection to the outside of the module, or a low degree of freedom of wire routing in the module when a plurality of switching elements is mounted in the same module. To equalize the inductances, it is necessary to adjust switching elements in conformance to switching elements provided with the longest signal lines, even if the adjusted switching elements could have otherwise shorten their signal lines. A problem with this case is that the switching time is prolonged and the switching loss increases. To switch the switching elements at high frequencies, it is necessary to prolong the dead time provided to avoid the simultaneous short-circuiting of the switching elements of the upper and lower arms, which results in the problem of the potential voltage distortion or the increase in iron loss of the motor due to the voltage distortion.

SUMMARY

The present invention has been made in view of the above, and it is an object of the present invention to provide a motor drive apparatus capable of suppressing the increase in loss of the switching element or the motor while eliminating the difference in the switching timing among the switching elements when the switching elements are connected in parallel.

In order to solve the above problems and achieve the object, a motor drive apparatus according to the present invention is a motor drive apparatus for driving a motor. The motor drive apparatus includes inverter modules equal in number to phases of the motor, and each of the inverter modules includes a plurality of switching element pairs, each of the switching element pairs being defined by two switching elements connected in series. In each of the inverter modules, the plurality of switching element pairs are connected in parallel, and each of resistance values of gate resistors connected to the switching elements is set for the corresponding switching element connected thereto.

The motor drive apparatus according to the present invention has an effect of suppressing the increase in loss of the switching elements or the motor while eliminating the difference in the switching timing among the switching elements when the switching elements are connected in parallel.

DETAILED DESCRIPTION

Hereinafter, a motor drive apparatus and an air conditioner according to embodiments of the present invention will be described in detail with reference to the drawings. The invention is not limited to the embodiments.

First Embodiment

Figure 1:
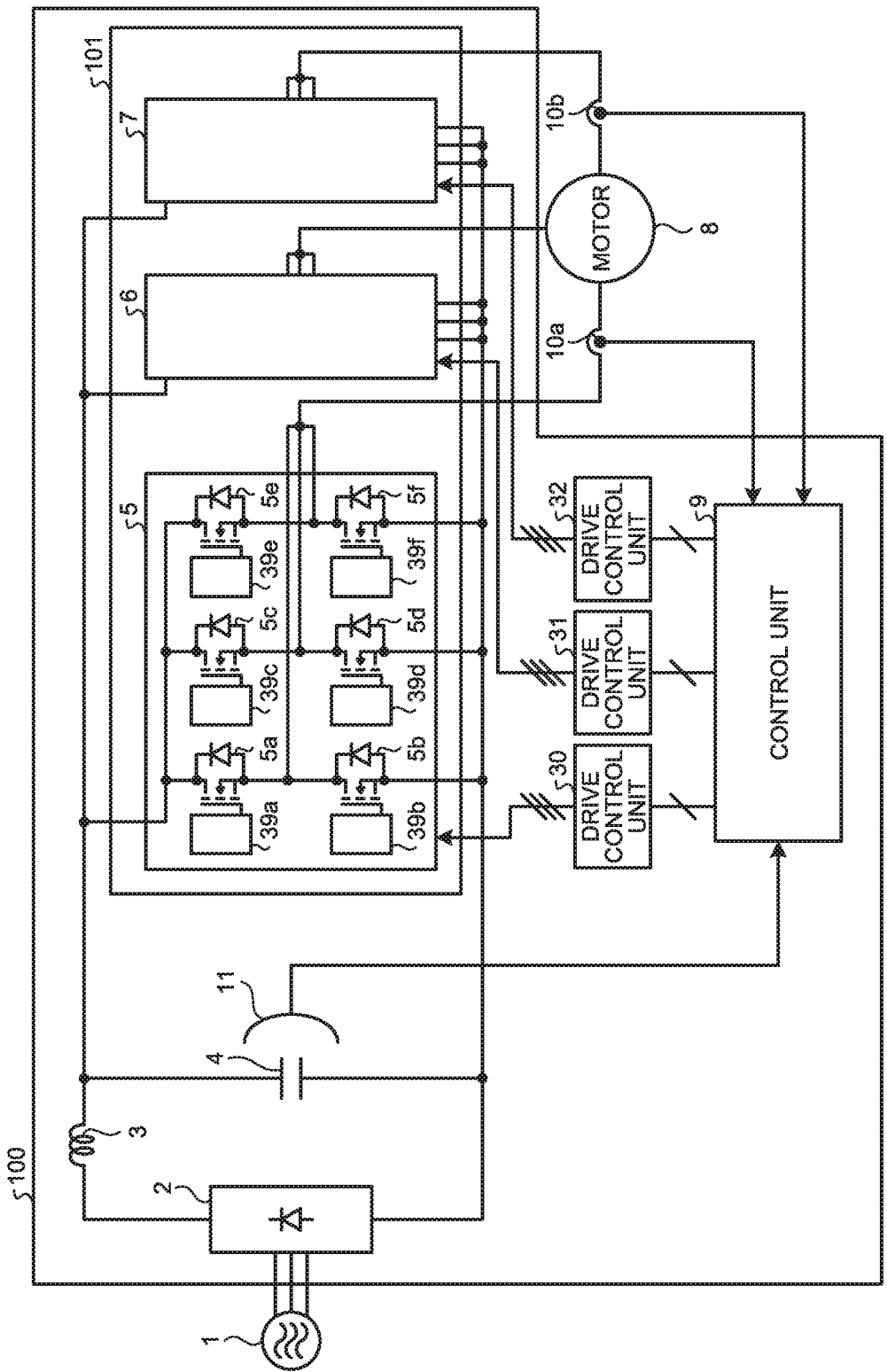
FIG. 1 is a diagram illustrating a configuration example of a motor drive apparatus according to a first embodiment.

FIG. 1 is a diagram illustrating a configuration example of a motor drive apparatus 100 according to a first embodiment of the present invention. As illustrated in FIG. 1, the motor drive apparatus 100 for driving a motor 8, or an electric motor, includes a rectifier 2, a reactor 3, a capacitor 4, a voltage detection unit 11, inverter modules 5, 6, and 7, a control unit 9, and drive control units 30, 31, and 32. The rectifier 2 rectifies an alternating current input from an alternating-current power supply 1, into a direct current. The voltage detection unit 11 detects a voltage across the capacitor 4. The inverter modules 5, 6, and 7 convert the direct current into a three-phase alternating current to drive the motor 8 that is a three-phase motor. The control unit 9 generates a PWM signal which is a drive signal for controlling the inverter modules 5 to 7. Current measurement units 10a and 10b which measure a motor current are provided between the inverter module 5 and the motor 8 and between the inverter module 7 and the motor 8. The inverter modules 5, 6, and 7 define an inverter unit 101.

The motor drive apparatus 100 can be used as an apparatus which drives a motor in an air conditioner, a freezing machine, a washer/dryer, a refrigerator, a dehumidifier, a heat pump water heater, a showcase, a vacuum cleaner, a fan motor, a ventilator, a hand dryer, an induction heating electromagnetic cooker, and the like.

The inverter unit 101 includes inverter the modules 5, 6, and 7 corresponding to a U phase, a V phase, and a W phase, respectively. The motor drive apparatus 100 includes the inverter modules which is equal in number to phases of the motor 8. In this embodiment, the apparatus 100 includes the three inverter modules. Each of the inverter modules 5, 6, and 7 includes switching elements 5a, 5b, 5c, 5d, 5e, and 5f, and drive control circuits 39a, 39b, 39c, 39d, 39e, and 39f which drive the switching elements 5a, 5b, 5c, 5d, 5e, and 5f, respectively. In each inverter module, the switching elements 5a, 5c, and 5e define an upper arm, and the switching elements 5b, 5d, and 5f define a lower arm. Two switching elements, or one switching element of the upper arm and the other switching element of the lower arm are connected in series to form a switching element pair. Specifically, the switching elements 5a and 5b define a switching element pair, the switching elements 5c and 5d define a switching element pair, and the switching elements 5e and 5f define a switching element pair. Even when a current capacity of each of the switching elements 5a to 5f is small, the motor drive apparatus 100 achieves a large current capacity because the switching elements for each phase are connected in parallel, that is, because the switching element pair defined by the switching elements 5a and 5b, the switching element pair defined by the switching elements 5c and 5d, and the switching element pair defined by the switching elements 5e and 5f are connected in parallel to one another, as illustrated in FIG. 1. The configuration of each of the inverter modules 6 and 7 is similar to the configuration of the inverter module 5. In order to simplify the description, the configuration and reference signs in the inverter modules 6 and 7 are omitted in FIG. 1.

The control unit 9 receives inputs that are a bus voltage detected by the voltage detection unit 11 and motor currents measured by the current measurement units 10a and 10b, and controls the inverter unit 101 on the basis of the bus voltage and the motor currents. Specifically, the control unit 9 generates PWM signals Up, Vp, Wp, Un, Vn, and Wn for controlling ON/OFF states of the switching elements for each phase and arm, and outputs the PWM signals to the drive control units 30 to 32. The PWM signals Up, Vp and Wp are PWM signals for controlling the ON/OFF states of the switching elements of the upper arms of the U, V, and W phases. The PWM signals Un, Vn and Wn are PWM signals for controlling the ON/OFF states of the switching elements of the lower arms of the U, V, and W phases. The PWM signal is a pulse signal which has either a High value indicating an ON state, that is, a closed state, or a Low value indicating an OFF state, that is, an open state. The width of a pulse, that is, a period during which the ON state continues is referred to as a pulse width. Since each of the inverter modules 5, 6, and 7 of the inverter unit 101 is defined by the three switching elements for the same arm of the same phase, the control unit 9 determines the pulse width on the basis of currents flowing when the three switching elements are turned ON. That is, the control unit 9 regards the three switching elements as one switching element having a large current capacity, and generates the PWM signals, accordingly.

Each of the drive control units 30 to 32 generates the PWM signals for driving the switching elements 5a, 5b, 5c, 5d, 5e, and 5f by the PWM for the corresponding phase, that is, for the corresponding one of the inverter modules 5, 6, and 7, on the basis of the PWM signals generated by the control unit 9. Specifically, the drive control unit 30 replicates the PWM signals Up and Un input from the control unit 9 to thereby generate three PWM signals Up and three PWM signals Un. The drive control unit 30 outputs the three PWM signals Up to the drive control circuits 39a, 39c, and 39e of the inverter module 5 corresponding to the U phase, and outputs the three PWM signals Un to the drive control circuits 39b, 39d, and 39f of the inverter module 5 corresponding to the U phase. The drive control unit 31 replicates the PWM signals Vp and Vn input from the control unit 9 to thereby generate three PWM signals Vp and three PWM signals Vn. The drive control unit 31 outputs the three PWM signals Vp to the drive control circuits 39a, 39c, and 39e of the inverter module 6 corresponding to the V phase, and outputs the three PWM signals Vn to the drive control circuits 39b, 39d, and 39f of the inverter module 6 corresponding to the V phase. The drive control unit 32 replicates the PWM signals Wp and Wn input from the control unit 9 to thereby generate three PWM signals Wp and three PWM signals Wn. The drive control unit 32 outputs the three PWM signals Wp to the drive control circuits 39a, 39c, and 39e of the inverter module 7 corresponding to the W phase, and outputs the three PWM signals Wn to the drive control circuits 39b, 39d, and 39f of the inverter module 7 corresponding to the W phase. Although FIG. 1 illustrates the drive control units 30 to 32 arranged outside the inverter modules 5 to 7, this arrangement is merely an example. Needless to say, the drive control units 30 to 32 may be disposed inside the inverter modules 5 to 7, thereby achieving the similar effect.

Any elements may be used as the switching elements 5a to 5f. For example, a wide band gap semiconductor formed of gallium nitride (GaN), silicon carbide (SiC), diamond or the like can be used. Use of the wide band gap semiconductor for the switching element increases voltage resistance and allowable current density, so that the module can be miniaturized. The wide band gap semiconductor also has high heat resistance, and thus a heat radiation fin of a heat radiation unit can be miniaturized, as well. Since a high-speed switching operation can be performed with the wide band gap semiconductor, the loss per switching is small, and accordingly, high frequency switching can be performed while suppressing an increase in loss.

Next, a general inverter which drives a three-phase motor will be described as a comparative example. In general, when an inverter is used to drive a three-phase motor, the inverter includes, for each phase, a switching element pair defined by one switching element of an upper arm and one switching element of a lower arm connected in series with the switching element of the upper arm. Thus, the inverter of the comparative example includes the three pairs of the switching elements, that is, the six switching elements in total for the three phases. Where the switching element is mounted as a chip, as described in the background section, when the chip area is increased, the yield deteriorates, and when the chip area is reduced, the yield can be improved. In particular, when SiC is used as the switching element, the wafer is expensive, and therefore it is desirable to reduce the chip area in order to reduce the cost. Where a household air conditioner allows use of an inverter module having a small current capacity, the inverter module used can be an inverter module which controls the three phases by using the six switching elements of the small chip areas. The use of this inverter having the six switching elements of the small chip areas achieves the cost reduction.

Unfortunately, when the chip area is reduced, the current capacity of the switching element is reduced. For this reason, both the cost reduction and the increase in current is difficult to achieve in the inverter module of the comparative example, that is, the inverter module which drives the three-phase motor by using the six switching elements. On the other hand, in the present embodiment, both the cost reduction and the increase in current can be achieved by using the switching elements of the small current capacities arranged in parallel. The one inverter module for the three phases defined by the six switching elements indicated in the comparative example can share the basic part with the inverter modules 5, 6, and 7 each defined by the six switching elements of the present embodiment, as illustrated in FIG. 1. Thus, the one inverter module for the three phases defined by the six switching elements can be used as each of the inverter modules 5, 6, and 7 with or without simple modification. In other words, the one inverter module for the three phases and the inverter modules 5, 6, and 7 illustrated in FIG. 1 can be manufactured as the same or similar modules. Thus, the inverter modules 5, 6, and 7 of the large current capacities can be manufactured at a low cost. For example, the one module for the three phases defined by the six switching elements can be used for a household air conditioner, and the inverter unit 101 including the three inverter modules 5, 6, and 7 as illustrated in FIG. 1 can be used for an industrial air conditioner. For the purpose of distinction from the inverter unit 101 of the present embodiment, an inverter using the one pair of switching elements for each phase as in the comparative example is hereinafter referred to as a single pair inverter, while the modules having the switching elements for the three phases, that is, the three pairs of switching elements mounted as one module is referred to as a single inverter module.

As illustrated in FIG. 1, the inverter module 5 includes the three pairs of switching elements. For the single pair inverter, each of the upper and lower arms for the same phase is defined by the one switching element. In contrast to the single pair inverter, in the present embodiment, each of the upper and lower arms for the same phase is defined by the three switching elements. The current capacity of the inverter module having the three switching elements connected in parallel is ideally 3 A(m) where the current capacity of the mounted switching element is denoted by reference sign "A(m)".

In the present embodiment, the three switching elements of the same arm for the same phase perform an operation similar to an operation of the one switching element of the single inverter module. That is, the three switching elements of the same arm for the same phase perform the same operations. Thus, currents flowing through the three switching elements of the same arm for the same phase are substantially the same. Unfortunately, even if the three switching elements of the same arm for the same phase perform the same operations, the currents flowing through the three switching elements actually differ from one another. That is, a current imbalance occurs among the three switching elements of the same arm for the same phase.

In particular, a switching element formed of SiC has a negative temperature characteristic, that is, the SiC-formed switching element has an on-resistance decreasing when the temperature rises due to flow of the current through the switching element, which results in a current more easily flowing through the switching element. When the switching elements having the foregoing characteristic are used, the temperature of the switching element through which a large amount of current flows increases upon occurrence of the current imbalance among the switching elements and thus a further larger current flows through such a switching element. The same applies where a switching element having the negative temperature characteristic such as an Insulated Gate Bipolar Transistor (IGBT) formed of Si is used besides the SiC-formed switching element. In order to prevent the current from exceeding the current capacity in each switching element even when the current imbalance occurs, it is required that the current capacity of the entire inverter module be set to a value obtained by subtracting a margin from the above-described ideal the current capacity of 3 A(m). Unfortunately, in order to increase the current capacity of the inverter module, a value of the above margin is desirably small.

Figure 2:
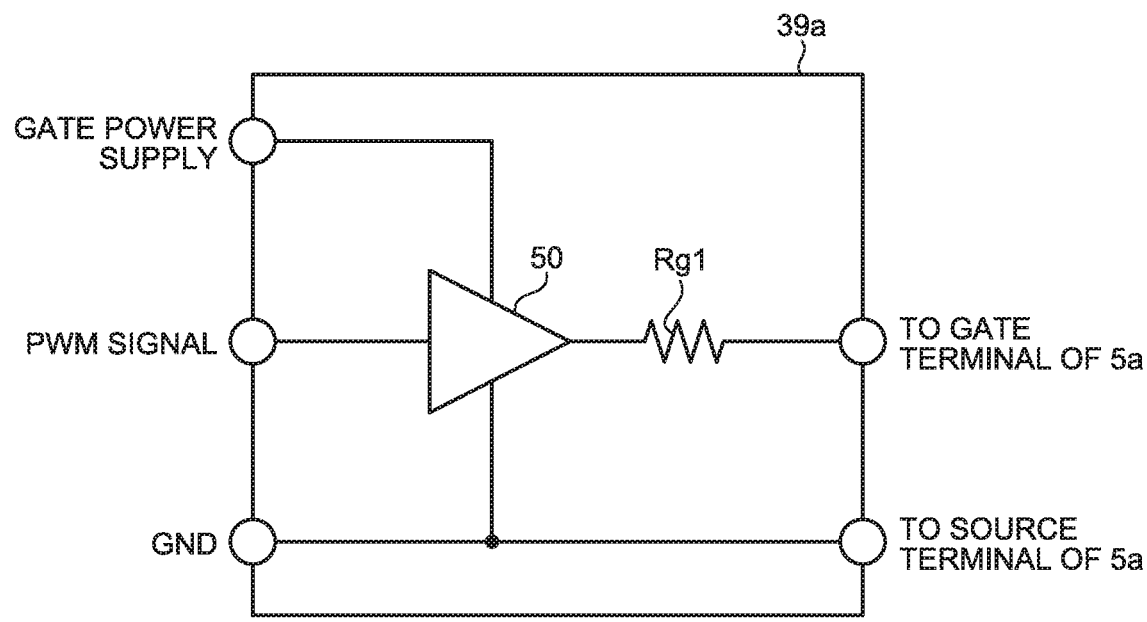
FIG. 2 is a diagram illustrating an internal circuit diagram of a drive control circuit which controls ON/OFF of a switching element according to the first embodiment.
Figure 3:
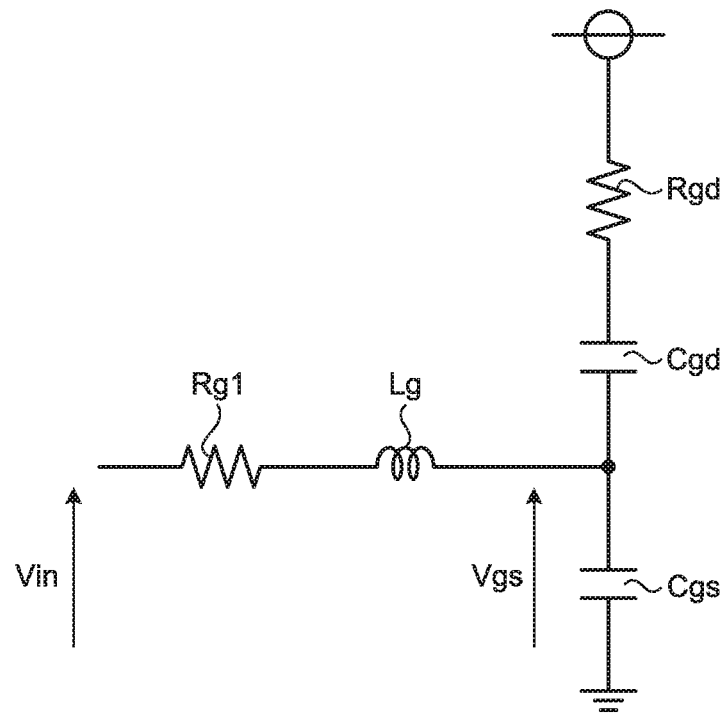
FIG. 3 is a diagram illustrating an example of an equivalent circuit of a gate resistor and the switching element in the drive control circuit according to the first embodiment.

Factors which cause the difference in currents flowing through the switching elements will be described. FIG. 2 is a diagram illustrating an example of an internal circuit diagram of the drive control circuit 39a which controls ON/OFF of the switching element 5a according to the first embodiment. FIG. 3 is a diagram illustrating an example of an equivalent circuit of a gate resistor Rg1 and the switching element 5a of the drive control circuit 39a according to the first embodiment. Although the description below is made using the drive control circuit 39a and the switching element 5a of the inverter module 5 by way of example, the same applies to the other drive control circuits 39b to 39f and the other switching elements 5b to 5f of the inverter module 5, as well as the drive control circuits 39a to 39f and the switching elements 5a to 5f of the inverter modules 6 and 7.

The PWM signal Up output from the drive control unit 30 is input to a gate terminal of the switching element 5a via a gate driver 50 and the gate resistor Rg1 within the drive control circuit 39a. The gate driver 50 controls charges of the switching element 5a in accordance with the PWM signal Up. The switching element 5a is turned ON when the charges are injected into the gate terminal by the drive control circuit 39a and is turned OFF when the charges are drawn from the gate terminal by the drive control circuit 39a. Even if the PWM signal Up output from the drive control unit 30 is not capable of controlling the charges, the gate driver 50 of the drive control circuit 39a can carry out the charging and discharging of the switching element 5a in accordance with the PWM signal Up because the gate driver 50 is supplied with power from a gate power supply connected to the gate driver 50. Although the gate resistor Rg1 is illustrated in the drive control circuit 39a in FIG. 2 by way of example, the gate resistor Rg1 may not be necessarily inside the drive control circuit 39a, and may be disposed outside the drive control circuit 39a rather than inside the circuit 39a as long as the gate resistor Rg1 is configured to provide the equivalent effect to that of the gate resistor Rg1 disposed inside the drive control circuit 39a.

In FIG. 3, reference sign "Lg" denotes an inductance by a signal line between the drive control circuit 39a and the switching element 5a, reference sign "Rgd" denotes a gate-drain resistance component, reference sign "Cgd" denotes a gate-drain capacitance component, and reference sign "Cgs" denotes a gate-source capacitance component. For the switching element 5a, as illustrated in FIG. 3, the gate-source capacitance component Cgs is charged upon the input of the PWM signal Up of a voltage value Vin from the gate terminal, such that a gate-source voltage Vgs increases. The switching element 5a is turned ON when the gate-source voltage Vgs exceeds a threshold voltage of the switching element 5a. The gate-source voltage Vgs can be expressed as the following formula (1). Since the following formula is applicable when the gate resistor is a gate resistor such as a gate resistor Rg2 or Rg3 in the second embodiment discussed later, the gate resistors Rg1, Rg2, and Rg3 are each expressed as a gate resistor Rg in the formula (1).

[Formula 1]

$$Vgs = Vin\left\{1 - e^{\frac{1}{(Cgs+Cgd)Rg}\left\{t + \frac{Lg}{Rg}\left(1 + c^{\frac{Lg}{Rg}t}\right)\right\}}\right\} \quad (1)$$

Figure 4:
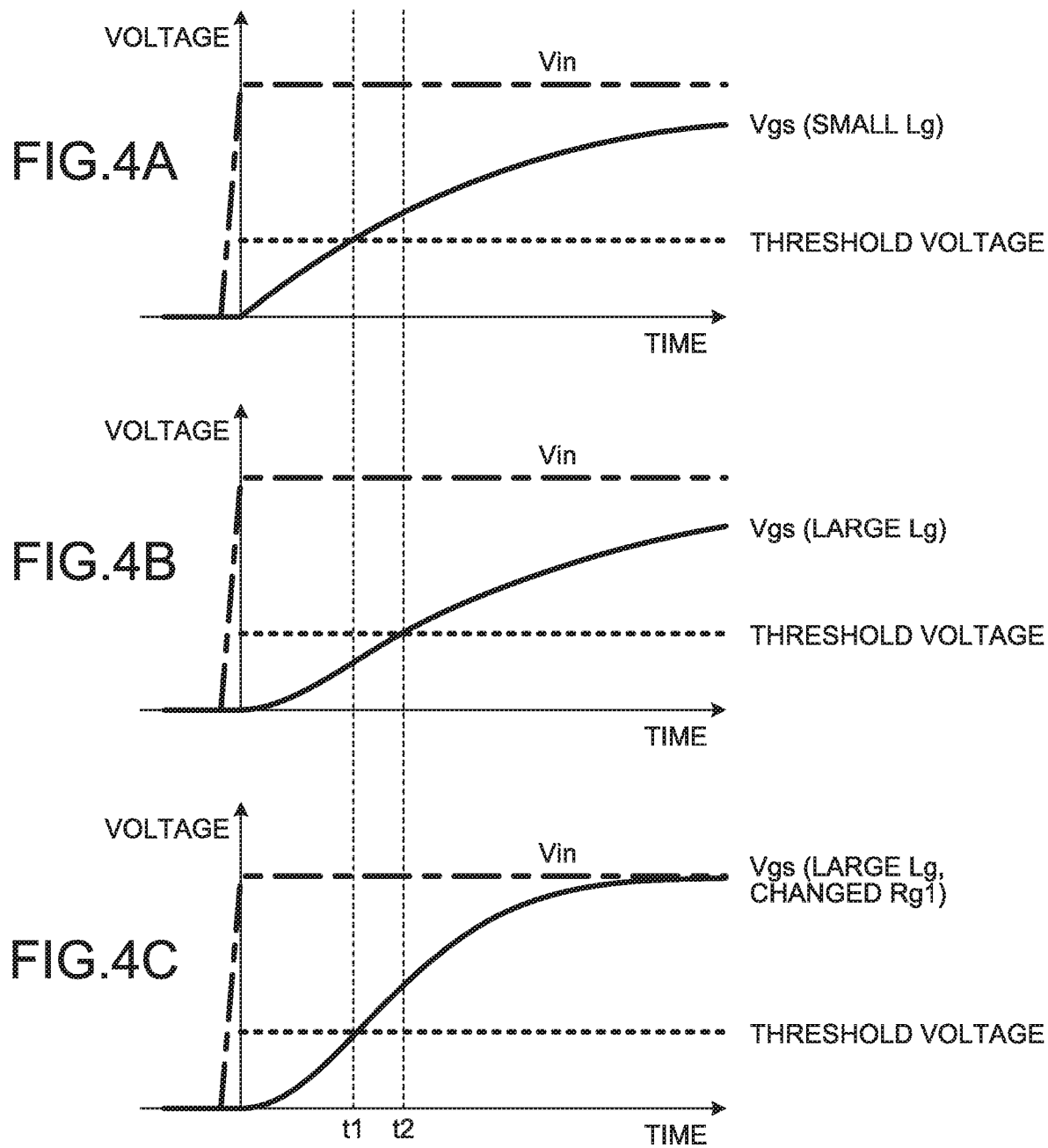
FIG. 4A is a diagram illustrating a relationship between a gate-source voltage, and an inductance and a gate resistor in the drive control circuit and the switching element according to the first embodiment.
FIG. 4B is a diagram illustrating a relationship between a gate-source voltage, and an inductance and a gate resistor in the drive control circuit and the switching element according to the first embodiment.
FIG. 4C is a diagram illustrating a relationship between a gate-source voltage, and an inductance and a gate resistor in the drive control circuit and the switching element according to the first embodiment.

FIGS. 4A to 4C are diagrams each illustrating a relationship between the gate-source voltage Vgs, and the inductance Lg and the gate resistor Rg1 in the drive control circuit 39a and the switching element 5a according to the first embodiment. The horizontal axis indicates a time and the vertical axis indicates a voltage. FIG. 4A illustrates a change in the gate-source voltage Vgs in a case where the inductance Lg is small, FIG. 4B illustrates a change in the gate-source voltage Vgs in a case where the inductance Lg is larger than that in FIG. 4A, and FIG. 4C illustrates a change in the gate-source voltage Vgs in a case where the inductance Lg is the same as that in FIG. 4B, but a magnitude of the gate resistor Rg1 is changed, specifically, the gate resistor Rg1 is decreased relative to that in FIG. 4B. FIGS. 4A to 4C illustrate switching timings of the switching element 5a. The switching element 5a is turned ON when the gate-source voltage Vgs increases to be equal to or higher than the threshold voltage. FIGS. 4A and 4C show that the gate-source voltage Vgs exceeds the threshold voltage after the elapse of t1 since the input of the PWM signal Up of the voltage value Vin, thereby turning the switching element 5a ON. FIG. 4B shows that the gate-voltage Vgs exceeds the threshold voltage after the elapse of t2, which is later than t1, since the input of the PWM signal Up of the voltage value Vin, thereby turning the switching element 5a ON.

Regarding the relationship illustrated in FIGS. 4A to 4C, the same applies to a relationship in another combination of a drive control circuit and a switching element within the inverter module 5. For the inverter module 5, when an inductance Lg of a signal line between the drive control circuit 39a and the switching element 5a, an inductance Lg of a signal line between the drive control circuit 39c and the switching element 5c, and an inductance Lg of a signal line between the drive control circuit 39e and the switching element 5e are different from one another, the gate-source voltages Vgs reach the threshold voltage at different times, as illustrated in FIGS. 4A and 4B, and therefore, the switching elements are turned ON at different timings. For the inverter module 5, for example, when the inductance Lg of the signal line between the drive control circuit 39a and the switching element 5a is smaller than the inductance Lg of the signal line between the drive control circuit 39c and the switching element 5c, the time when the gate-source voltage Vgs in the switching element 5a reaches the threshold voltage is earlier than in the switching element 5c. That is, the timing at which the switching element 5a is turned ON is earlier than the timing at which the switching element 5c is turned ON.

As in the case of the inverter module 5 illustrated in FIG. 1, when a difference in the turn-on timing occurs among the switching elements 5a, 5c, and 5e connected in parallel as described above, the current concentratedly flows through a switching element turned ON earlier. As a result, a problem such as breakage of the switching element turned ON earlier arises.

Although the inductance Lg is a value as small as several nH to several tens of nH, the inductance Lg largely affects switching timings of the switching elements. The inductances Lg thus should equalize in order to suppress the difference in the switching timing among the switching elements, but, unfortunately, such equalization of the inductances requires the high accuracy. Typically, the inverter module 5 is designed such that an inductance Lg of a signal line of a PWM signal between each drive control circuit and a corresponding switching element is minimal. That is, the inverter module 5 is designed such that the wiring length is the shortest. For the upper arm of the inverter module 5, in particular, the wiring length of the signal line of the PWM signal Up between the drive control circuit 39a and the switching element 5a, the wiring length of the signal line of the PWM signal Up between the drive control circuit 39c and the switching element 5c, and the wiring length of the signal line of the PWM signal Up between the drive control circuit 39e and the switching element 5e are each designed to be the shortest. Therefore, in order to equalize the inductances Lg of the signal lines, it is required that the inductances Lg of all the signal lines be equal to the inductance Lg of the signal line having the longest wiring length, which is the modification to increase the switching time. The same applies to the lower arm of the inverter module 5 and the other inverter modules 6 and 7.

In the present embodiment, meantime, the difference in the switching timing among the switching elements are suppressed by adjusting a resistance value of the gate resistor Rg1 connected to the switching element in each of the signal lines. For a signal line having a large inductance Lg, for example, the value of the gate resistor Rg1 is made small. As described above, FIG. 4A and FIG. 4B demonstrate that, with respect to the same PWM signal Up, a time for the gate-source voltage Vgs to reach the threshold voltage differs depending on the magnitude of the inductance Lg. Changing the value of the gate resistor Rg1 in FIG. 4B provides the graph illustrated in FIG. 4C. With reference to FIGS. 4B and 4C, changing the value of the gate resistor Rg1, in particular, reducing the resistance value of the gate resistor Rg1 allows the gate-source voltage Vgs in FIG. 4B to reach the threshold voltage at a time equivalent to a time at which the gate-source voltage Vgs in FIG. 4C, that is, the gate-source voltage Vgs in FIG. 4A reaches the threshold voltage. From FIGS. 4A to 4C, it can be seen that, in each signal line, the value of the gate resistor Rg1 should be made small when the inductance Lg is large, and the value of the gate resistor Rg1 should be made large when the inductance Lg is small. That is, a magnitude of the inductance value of the wiring of the signal line is inversely related to a magnitude of the value of the gate resistor Rg1. As described above, the inductance Lg depends on the wiring length of the signal line. This means that the wiring length of the signal line is inversely related to the magnitude of the value of the gate resistor Rg1. The inverter module 5 achieves the modification to shorten the switching time of the signal line having a large inductance Lg, so that the switching loss can be reduced. Since the high-speed switching operation can be performed, it is possible to shorten the dead time for avoiding simultaneous short-circuiting of the upper and lower switching elements. Thus, the inverter module 5 can reduce the distortion of a voltage output to the motor 8, and reduce the motor iron loss of the motor 8. In the inverter module 5, each of the gate resistors Rg1 connected to the switching elements 5a, 5c, and 5e of the upper arm connected in parallel has a resistance value set for the corresponding switching element connected thereto. Also, each of the gate resistors Rg1 connected to the switching elements 5b, 5d, and 5f of the lower arm connected in parallel has a resistance value set for the corresponding switching element connected thereto.

When there is a variation in the threshold voltage among the switching elements 5a, 5c, and 5e of the upper arm in the inverter module 5, the similar difference in the switching timing occurs. Since the switching element for which a small threshold voltage is set is turned ON at an earlier timing, the current concentratedly flows through such a switching element with the small threshold voltage set. This results in a problem such as breakage of the switching element with the small threshold voltage set. The same applies where there is a variation in the threshold voltage among the switching elements 5b, 5d, and 5f of the lower arm in the inverter module 5. The same goes for the switching elements 5a to 5f of the other inverter modules 6 and 7.

In the present embodiment, the value of each gate resistor Rg1 is adjusted to thereby suppress the difference in the switching timing among the switching elements of the inverter module 5. For example, the value of the gate resistor Rg1 to be connected to a switching element with a large threshold voltage set should be decreased. Also, the value of the gate resistor Rg1 to be connected to a switching element with a small threshold voltage set should be increased. As a result, the switching elements of the inverter module 5 can reach the threshold voltages at times equal to one another. It is thus possible to obtain the similar effect to an effect provided by the measures taken where the signal lines have the different magnitudes of the inductance Lg. The resistance values of the gate resistors Rg1 of the drive control circuits 39a to 39f built in the inverter module 5 may be adjusted by laser irradiation called trimming in manufacturing the inverter modules. Although FIG. 2 illustrates only one resistor, the gate resistor Rg1 may be defined by plural resistors connected in parallel and the combinations of these resistors may be modified to adjust the resistance value of the gate resistor Rg1. In addition to changing the resistance value of each gate resistor Rg1 in producing the inverter module 5, pins may project out of the inverter module 5 so that an external resistor can be attached to the pins and thus connected in parallel to the gate resistor Rg1, thereby changing the resistance value. Needless to say, the similar effect can be provided by any means capable of adjusting the resistance value of the gate resistor Rg1 to suppress the difference in the switching timing.

A method for suppressing the difference in the switching timing among the switching elements of the inverter module 5 may include, for example, a method for bringing the switching timings of the switching elements 5a, 5c, and 5e of the upper arm to a certain switching timing determined taking account of the relative relation among them, and a method for bringing the switching timings of the switching elements 5a, 5c, and 5e of the upper arm to a specified timing. Taking account of, for example, the dead time relative to the switching elements 5b, 5d, and 5f of the lower arm, it is desirable that each of the switching timings of the switching elements 5a, 5c, and 5e of the upper arm be made equal to the specified timing. When each of the switching timings of the switching elements 5a, 5c, and 5e is made equal to the specified timing, it is not necessary to take account of the switching timings of the other switching elements, and thus the adjustment can be made easily. The specified timing is achieved by the method including, but not limited to, a method for adjusting the gate resistor Rg1 so that the gate-source voltage Vgs reaches the threshold voltage after the elapse of t1 since the input of the PWM signal Up of the voltage value Vin in FIG. 4.

In particular, when there is a correlation between a variation in the threshold voltage and a variation in the on-resistance, a switching element with a large threshold voltage set has a large on-resistance, which may increase both the switching loss and the conduction loss. For the switching element with the large threshold voltage set, the gate resistor Rg1 is reduced as described above to thereby reduce the switching loss and thus a difference in total loss between this switching element and the other switching elements connected in parallel thereto. As a result, the inverter module 5 can prevent a partial failure such as a one-element failure or a one-phase failure.

Methods for adjusting the switching timings of the other switching elements 5b to 5f of the inverter module 5 are each similar to the above-described method for adjusting the switching timing of the switching element 5a. In addition, methods for adjusting the switching timings of inverter modules 6 and 7 of the V-phase and W-phase are each similar to the above-described method for adjusting the switching timing of the U-phase.

In some general-purpose inverter modules, source terminals of a lower arm are not connected together inside a module, but are separated from one another. When such a module is used, currents flowing through the switching elements of the lower arm disposed in a parallel relationship can be individually detected, such that when current imbalance occurs, this current imbalance can be suppressed by, for example, the correction to the PWM signal based on the results of the detection. On the other hand, the upper arm has its terminals on the drain side that are typically connected together inside the module, and thus the individual currents flowing through the switching elements disposed in a parallel relationship are difficult to detect. In such a case, the adjustment of the switching timings according to the present embodiment may be applied only to the upper arm of the upper and lower arms of the inverter module.

As described above, according to the present embodiment, the motor drive apparatus includes the inverter module for each phase, the inverter module including a plurality of pairs of switching elements, the switching-element pairs being connected in parallel, each of the switching-element pairs being defined by the one switching element of the upper arm and the one switching element of the lower arm. This arrangement makes it possible to achieve the increase in current while suppressing the cost.

In the present embodiment, the plurality of the switching elements defining the inverter module is designed such that the resistance values of the gate resistors are adjusted to thereby suppress the imbalance of the currents among the switching elements. As a result, it is not necessary to take into account the current imbalance when determining the current capacity of the inverter module, and thus the current capacity of each switching element can be effectively utilized. In the inverter module, there is no need to detect a shunting state of the current of each switching element, so that a current detector is not required for each switching element. Consequently, it is unlikely that the substrate area and the cost increase due to the current detector. As compared to a case where an inexpensive shunt resistor is used as the current detector, an increase in loss can be suppressed. Since voltage fluctuation due to the wiring for connection of the current detector and an impedance component of the current detector itself can be avoided, an erroneous operation due to the voltage fluctuation and the like can be suppressed and the reliability can be improved. For the general-purpose module having the terminals of the upper arm on the drain side connected together within the module, the current imbalance among the switching elements can be suppressed only by changing the resistance values of the gate resistors, and therefore there is no need to newly generate a metal mold or the like, and business investment can be suppressed. Furthermore, since it is also possible to accommodate the difference in the switching timing due to the variation in the threshold voltage among the respective switching elements, a step of selecting the characteristic of the switching element can be eliminated or the time required for the step can be shortened. Furthermore, it is possible to eliminate the difference in the switching timing regardless of a positional relationship between each of the terminals and a corresponding switching element or the degree of freedom of routing, and to suppress an increase in loss of the switching element or the motor.

In the example of FIG. 1, the inverter module for one phase is defined by the three pairs of switching elements, but the inverter module is not limited to the example of FIG. 1. The inverter module for one phase may be defined by a plurality of pairs of switching elements. For example, the inverter module defined by two pairs of (i.e. four) switching elements may be used as an inverter module for one phase. In that case, the inverter module can be used with an inverter module of the low current capacity defined by four switching elements for two phases. FIG. 1 illustrates, by way of example, the connected motor 8 that is the three-phase motor, but the motor 8 is not limited to the three-phase motor. The motor drive apparatus can achieve the cost reduction and the increase in current similarly to the example of FIG. 1 by using the inverter modules equal in number to the phases of the motor.

In the example of FIG. 1, the one inverter module is used for one phase, but a plurality of inverter modules may be provided for one phase. For example, two inverter modules may be connected in parallel and used for one phase, and thereby the inverter modules the number of which is twice the number of phases may be used. Although FIG. 1 illustrates the example in which the alternating current from the alternating-current power supply 1 is rectified by the rectifier 2, any configuration that inputs the direct current to the inverter modules 5 to 7 may be employed. For example, a direct current is input from a direct-current power supply to the inverter modules 5 to 7 unlike the example of FIG. 1.

Second Embodiment

The first embodiment has been described giving an example of the use of the gate resistors having values varying depending on the difference between the inductances of the signal lines of the PWM signals or between the threshold voltages of the switching elements. A second embodiment is described giving an example in which a gate resistor has a resistance-value-varying function.

Figure 5:
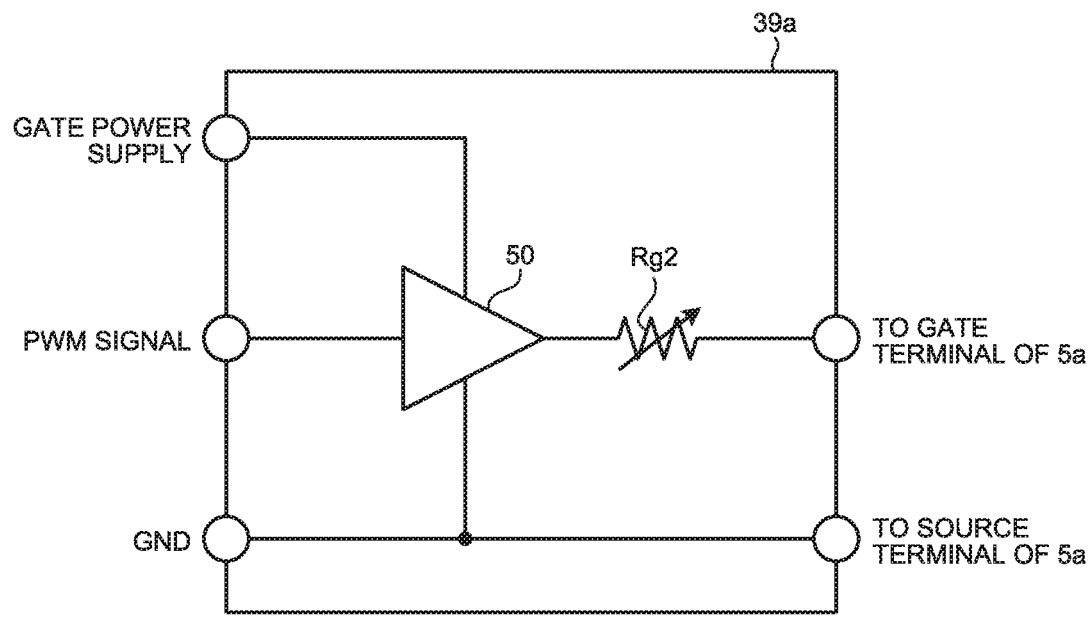
FIG. 5 is a diagram illustrating an example of an internal circuit diagram of a drive control circuit which controls ON/OFF of a switching element according to a second embodiment.

A description of elements common to those of the first embodiment is omitted, and a difference between the first embodiment and the second embodiment is described. FIG. 5 is a diagram illustrating an example of an internal circuit diagram of the drive control circuit 39a which controls ON/OFF of the switching element 5a according to the second embodiment. As compared to the drive control circuit 39a of the first embodiment illustrated in FIG. 2, the gate resistor Rg1 is eliminated therefrom and the gate resistor Rg2 having the resistance-varying function is added thereto. The gate resistor Rg2 is a variable resistor having a variable resistance value. As a result, even when the difference in the switching timing among the switching elements occurs due to a factor external to the inverter module 5, the difference in the switching timing can be suppressed, and the effect similar to that in the first embodiment can be obtained. The same applies to the drive control circuits 39b to 39f of the inverter module 5 and the drive control circuits 39a to 39f of the other inverter modules 6 and 7.

The factor external to the inverter module 5 may include, for example, an impedance component due to the wiring or a component on a substrate to which the inverter module 5 is attached, and a temperature in use. To address the former external factor, it is optimal to suppress the current imbalance in conformance to the substrate designed by a user who purchases and uses the inverter module 5. To address the latter external factor, product installers, product maintenance contractors, or the like of products adjust the products in accordance with the climate or the season of an area for installation of the products, thereby improving the reliability.

A method for varying a resistance value of the gate resistor Rg2, that is, a method for adjusting a resistance value of the gate resistor Rg2 may be either analog or digital.

Figure 6:
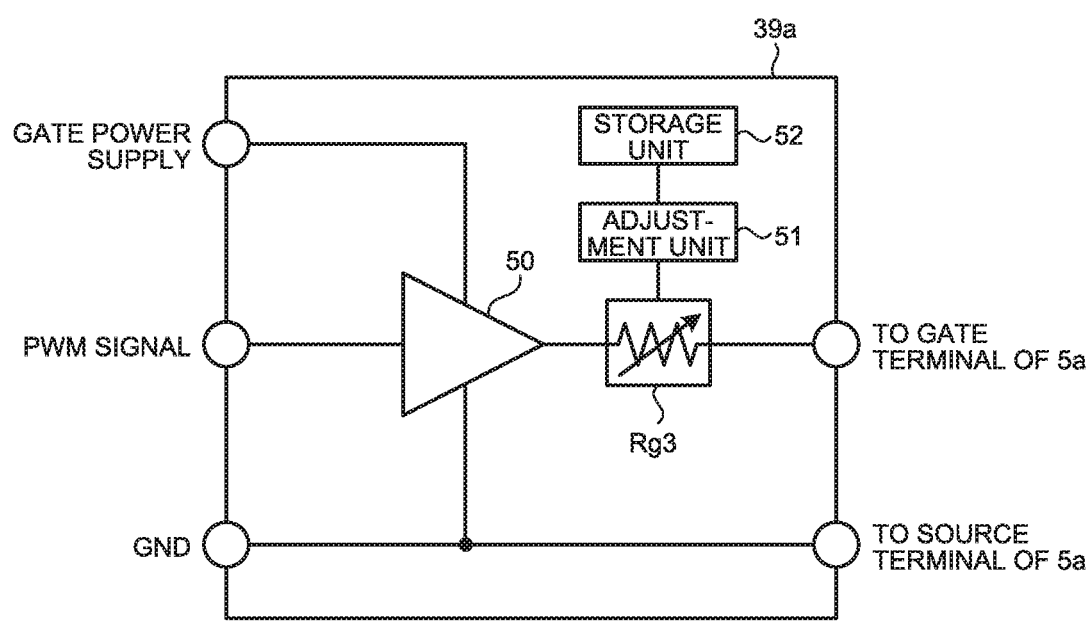
FIG. 6 is an internal circuit diagram of the drive control circuit which controls ON/OFF of the switching element according to the second embodiment in a case where a gate resistor is automatically adjusted.

To digitally adjust the resistance value of the gate resistor Rg2, an adjustment unit such as a microcomputer, which can vary the resistance value, is used to adjust the gate resistor Rg2 to an optimum resistance value in accordance with an operating condition of the motor drive apparatus 100 on the basis of information regarding a temperature at a start of or during an operation of the motor drive apparatus 100. The drive control circuits 39a to 39f may have a memory function. FIG. 6 is an internal circuit diagram of the drive control circuit 39a which controls ON/OFF of the switching element 5a according to the second embodiment in a case where the gate resistor Rg3 is automatically adjusted. Unlike the drive control circuit 39a of FIG. 5, the drive control circuit 39a does not include the gate resistor Rg2, and instead, includes the gate resistor Rg3, an adjustment unit 51, and a storage unit 52. In order to achieve the memory function, the adjustment unit 51 acquires and compares pieces of information on the gate-source voltage Vgs of the switching element 5a and the voltage value Vin of the PWM signal Up input to the drive control circuit 39a, thereby recognizing a switching delay of the switching element 5a. In order to eliminate the switching delay of the switching element 5a, the adjustment unit 51 reads, from the storage unit 52 which stores information on a resistance value of the gate resistor Rg3 corresponding to the delay, this information on the resistance value, and adjusts the resistance value of the gate resistor Rg3. In a case where the information stored in the storage unit 52 is operation data regarding the switching element 5a, the variation in the switching delay changes depending on the operation state, in other words, a value of a flowing current. Thus, the adjustment unit 51 adjusts the resistance value of the gate resistor Rg3 in accordance with the current value of the signal line of the PWM signal Up between the drive control circuit 39a and the switching element 5a. When the drive control circuits 39a to 39f of the inverter modules 5 to 7 have the memory functions, the adjustment unit 51 and the storage unit 52 are provided for each gate resistor Rg2 or each gate resistor Rg3. As a result, the current imbalance of the switching element 5a of the drive control circuit 39a can be suppressed. Since the self-adjustment is achieved without instructions from the outside of the inverter module 5, it is possible to reduce the user's effort for the adjustment labor.

On the other hand, to analogically adjust the resistance value of the gate resistor Rg2 of the drive control circuit 39a illustrated in FIG. 5, pins may project out of the inverter module 5 such that an external resistor can be mounted to change the combined resistance of the resistors connected in parallel as described in the first embodiment. Alternatively, a variable resistor is mounted in the inverter module 5 and is mechanically changeable from the outside. Furthermore, pins may project for allowing the selection of the resistors inside the inverter module 5 such that transistors or the like inside the inverter module 5 are used to provide the open- or short-circuit, thereby changing the resistance value. In that case, it is necessary for the user himself or herself to make the adjustment, but it is possible to reduce the user's effort for the adjustment by providing an adjustment circuit (not illustrated) which automatically performs the adjustment.

As described above, according to the present embodiment, the motor drive apparatus is configured such that the resistance value of the gate resistor of the drive control circuit can be changed. As a result, the inverter module of the second embodiment can be used in the same manner as the inverter modules of general-purpose use which do not include the parallel configuration. In addition, since the application of the inverter module is expanded, it is expected that the production quantity of the inverter module will increase, and therefore, the cost of the inverter module can be reduced.

Third Embodiment

In a third embodiment, an air conditioner which includes the motor drive apparatus 100 described in the first or second embodiment will be described.

Figure 7:
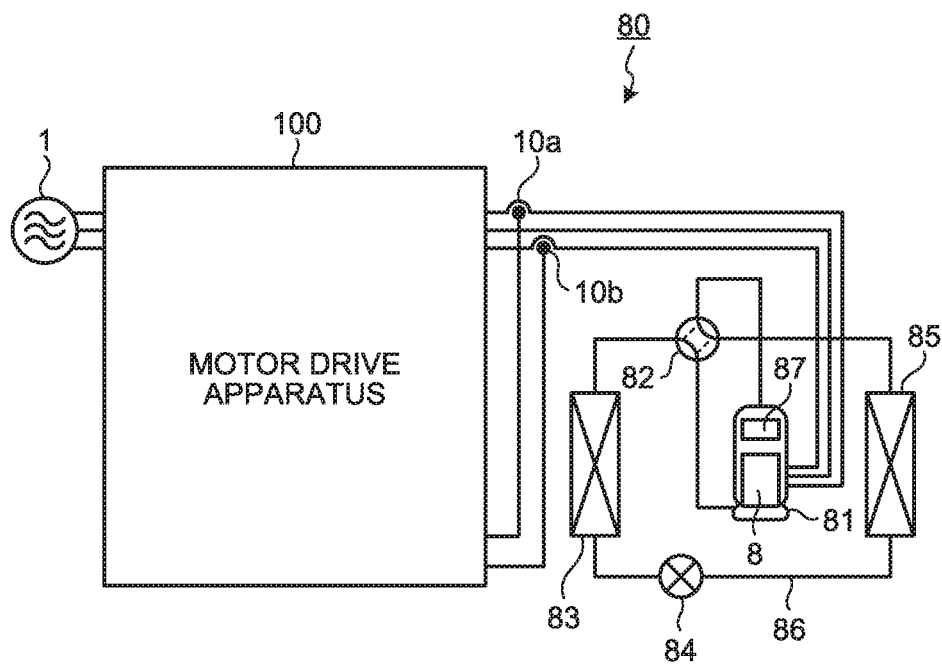
FIG. 7 is a diagram illustrating a configuration example of an air conditioner according to a third embodiment.

FIG. 7 is a diagram illustrating a configuration example of the air conditioner 80 according to the third embodiment. The air conditioner 80 can include the motor drive apparatus 100 described in the first or second embodiment. The air conditioner 80, which is a split-type air conditioner, has a refrigeration cycle in which a compressor 81 incorporating the motor 8 therein, a four-way valve 82, an outdoor heat exchanger 83, an expansion valve 84, and an indoor heat exchanger 85 are mounted via a refrigerant pipe 86.

A compression mechanism 87 which compresses a refrigerant and the motor 8 which operates the compression mechanism 87 are provided in the compressor 81. For the air conditioner 80, the refrigerant is circulated from the compressor 81 through the outdoor heat exchanger 83 and the indoor heat exchanger 85, which achieves the refrigeration cycle to perform cooling, heating, and the like. The configuration of the air conditioner 80 using the motor drive apparatus 100 illustrated in FIG. 7 is an example, and the motor drive apparatus 100 can be applied also to a device having a refrigeration cycle such as a refrigerator, a freezer, or the like.

As described above, according to the present embodiment, the air conditioner includes the motor drive apparatus described in the first or second embodiment. As a result, it is possible to achieve an air conditioner allowing for the cost reduction and the increase in current.

In addition, since the air conditioner includes the motor drive apparatus having the plurality of pairs of switching elements for each phase, even when the switching element fails, the operation can continue using the other switching elements. When the switching element fails, the air conditioner can perform an operation such as issuing an alarm to the user while continuing the operation thereof at a lower capacity than usual.

The configuration described in each embodiment above indicates one example of the content of the present invention and can be combined with other known technology, and a part thereof can be omitted or modified without departing from the gist of the present invention.

The invention claimed is:

1. A motor drive apparatus that drives a motor, the apparatus comprising:
   inverter modules equal in number to phases of the motor; and
   drive control circuits configured to supply drive signals to gate terminals of the switching elements via signal lines, respectively,
   wherein
   each of the inverter modules comprises a plurality of switching element pairs, each of the switching element pairs being defined by two switching elements connected in series,
   in each of the inverter modules, the plurality of switching element pairs are connected in parallel,
   each of resistance values of gate resistors connected to the switching elements is set for a corresponding switching element connected thereto, and
   a wiring length of each of the signal lines that transmits the driving signal for each of the switching elements and a magnitude of each of the gate resistors are inversely related to each other.

2. The motor drive apparatus according to claim 1, wherein a magnitude of an inductance value of wiring of a signal line that transmits a driving signal for each of the switching elements and a magnitude of the gate resistor are inversely related to each other.

3. The motor drive apparatus according to claim 1, wherein the gate resistor is a variable resistor having a resistance value variable.

4. The motor drive apparatus according to claim 3, wherein
   each of the inverter modules comprises, for each gate resistor,
   a storage unit that stores information on the resistance value of the gate resistor, and
   an adjustment unit that reads the information on the resistance value of the gate resistor stored in the storage unit and adjusts the resistance value of the gate resistor.

5. The motor drive apparatus according to claim 4, wherein the adjustment unit adjusts the resistance value of the gate resistor in accordance with an operation state of the motor drive apparatus.

6. The motor drive apparatus according to claim 1, wherein the switching elements are each formed of a wide band gap semiconductor.

7. The motor drive apparatus according to claim 6, wherein the wide band gap semiconductor is silicon carbide.

8. An air conditioner comprising:
   the motor drive apparatus according to claim 1; and
   a compressor that includes a motor driven by the motor drive apparatus.

9. The motor drive apparatus according to claim 1, wherein the gate resistors are provided in the drive control circuit, respectively.

\* \* \* \* \*